(12) United States Patent
Oh

(10) Patent No.: US 9,450,575 B2
(45) Date of Patent: Sep. 20, 2016

(54) CURRENT COMPARATOR AND ELECTRONIC DEVICE INCLUDING THE SAME

(71) Applicant: SK hynix Inc., Icheon-Si (KR)

(72) Inventor: Byoung-Chan Oh, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/624,355

(22) Filed: Feb. 17, 2015

(65) Prior Publication Data

US 2016/0072493 A1 Mar. 10, 2016

(30) Foreign Application Priority Data

Sep. 5, 2014 (KR) .................. 10-2014-0119223

(51) Int. Cl.
| | | |
|---|---|---|
| *G11C 11/00* | (2006.01) | |
| *H03K 5/24* | (2006.01) | |
| *G11C 7/12* | (2006.01) | |
| *G11C 13/00* | (2006.01) | |
| *G11C 7/06* | (2006.01) | |
| *G11C 7/08* | (2006.01) | |
| *G11C 11/16* | (2006.01) | |

(52) U.S. Cl.
CPC ............ *H03K 5/2472* (2013.01); *G11C 7/065* (2013.01); *G11C 7/08* (2013.01); *G11C 7/12* (2013.01); *G11C 11/1673* (2013.01); *G11C 13/004* (2013.01); *G11C 2013/0054* (2013.01); *G11C 2207/002* (2013.01); *G11C 2207/063* (2013.01)

(58) Field of Classification Search
CPC .......... G11C 13/0069; G11C 13/0004; G11C 13/0007
USPC ............... 365/148, 207, 210, 230.08, 189.07
IPC ..................... G11C 13/0069, 13/0004, 13/0007
See application file for complete search history.

(56) References Cited

U.S. PATENT DOCUMENTS

| | | | |
|---|---|---|---|
| 5,386,158 A * | 1/1995 | Wang | G11C 16/28 327/108 |
| 7,800,968 B2 * | 9/2010 | Kern | G11C 16/28 365/185.2 |
| 8,305,815 B2 | 11/2012 | La Rosa | |
| 8,737,120 B2 * | 5/2014 | Guo | G11C 7/062 365/163 |
| 8,953,384 B2 * | 2/2015 | Chan | G11C 11/5642 365/185.2 |
| 2006/0062066 A1 | 3/2006 | Garni | |

* cited by examiner

*Primary Examiner* — Connie Yoha
(74) *Attorney, Agent, or Firm* — Perkins Coie LLP

(57) ABSTRACT

A current comparator may include a current comparison block configured to compare current flowing through first and second input terminals; a first current control unit configured to control current flowing through the first input terminal in response to a voltage of a first node; a second current control unit configured to control current flowing through the second input terminal in response to a voltage of a second node; a first driving unit configured to drive the first node with a first voltage higher than a read voltage in a non-comparison period, and drive the first node with the read voltage in a comparison period; and a second driving unit configured to drive the second node with a second voltage higher than a reference voltage in the non-comparison period, and drive the second node with the reference voltage in the comparison period.

19 Claims, 11 Drawing Sheets

CURRENT COMPARATOR AND ELECTRONIC DEVICE INCLUDING THE SAME

CROSS-REFERENCE TO RELATED APPLICATIONS

This patent document claims priority of Korean Patent Application No. 10-2014-0119223, entitled "CURRENT COMPARATOR AND ELECTRONIC DEVICE INCLUDING THE SAME" and filed on Sep. 5, 2014, which is incorporated herein by reference in its entirety.

TECHNICAL FIELD

This patent document relates to memory circuits or devices including a current comparator, and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic appliances such as a computer, a portable communication device, and so on and research and development for such electronic devices have been conducted. Examples of such electronic devices can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes a current comparator which shortens settling times, thereby elevating a comparison speed.

Further, the disclosed technology in this patent document includes an electronic device which elevates an operation speed by using a current comparator with a high comparison speed.

In one aspect, a current comparator is provided to include: a current comparison block configured to compare current flowing through first and second input terminals; a first current control unit configured to control current flowing through the first input terminal in response to a voltage of a first node; a second current control unit configured to control current flowing through the second input terminal in response to a voltage of a second node; a first driving unit configured to drive the first node with a first voltage higher than a read voltage in a non-comparison period, and drive the first node with the read voltage in a comparison period; and a second driving unit configured to drive the second node with a second voltage higher than a reference voltage in the non-comparison period, and drive the second node with the reference voltage in the comparison period.

In some implementations, the first input terminal may be electrically coupled with a first load including an RC delay, through the first current control unit, and the second input terminal may be electrically coupled with a second load including an RC delay, through the second current control unit.

In some implementations, an amount of current flowing through the first input terminal may converge to a value based on a resistance value of the first load, and an amount of current flowing through the second input terminal may converge to a value based on a resistance value of the second load.

In some implementations, an amount of current flowing through the first input terminal may decrease as a resistance value of the first load increases, and an amount of current flowing through the second input terminal may decrease as a resistance value of the second load decreases.

In some implementations, the first load may be applied to a path including a variable resistance element, and the second load may be applied to a path including a reference resistance element for discriminating a resistance value of the variable resistance element.

In some implementations, the current comparison block may include: a first sensing node corresponding to the first input terminal; and a second sensing node corresponding to the second input terminal, and wherein the current comparison block operates in the non-comparison period to precharge the first and second sensing nodes, and operates in the comparison period to discharge the first and second sensing nodes using current flowing through the first and second input terminals and compare voltages of the first sensing node and the second sensing node.

In some implementations, the current comparison block may include: a coupling unit configured to electrically couple the first and second input terminals with the first and second sensing nodes, respectively, in the comparison period; an amplification unit configured to amplify a voltage difference of the first and second sensing nodes and output the amplified voltage difference to first and second output nodes, in the comparison period; and a precharge unit configured to precharge the first and second sensing nodes and the first and second output nodes.

In some implementations, the first voltage and the second voltage may have the voltage level of a power supply voltage.

In another aspect, a current comparator is provided to include: a current comparison block configured to compare current flowing through first and second input terminals during a comparison period; a first load corresponding to the first input terminal, and including a variable resistance element; a second load corresponding to the second input terminal, and including a reference resistance element for discriminating a resistance value of the variable resistance element; and a current driving block configured to provide a first current flowing through the first input terminal and the first load and a second current flowing through the second input terminal and the second load, such that the first and second currents exhibit peak values relatively shortly after entering the comparison period and starts to decrease, wherein the first and second loads include capacitance components and the capacitance components of the first load and second load are respectively charged by the first current and the second current.

In some implementations, the current driving block may operate in the comparison period to decrease a driving force for driving the first current, from a first value to a read value smaller than the first value, and decrease a driving force for driving the second current, from a second value to a reference value smaller than the second value.

In some implementations, the current driving block may control the driving force of the first current in response to a first control voltage and control the driving force of the second current in response to a second control voltage, and lower the first control voltage from a first level to a read level lower than the first level and lower the second control voltage from a second level to a reference level lower than the second level.

In some implementations, an amount of the first current may converge to a value based on a resistance value of the first load, and an amount of the second current may converge to a value based on a resistance value of the second load.

In some implementations, an amount of the first current may decrease as a resistance value of the first load increases, and an amount of the second current may decrease as a resistance value of the second load increases.

In another aspect, an electronic device is provided to include a semiconductor memory unit. The semiconductor memory unit may include: a plurality of storage cells, each including a variable resistance element exhibiting different resistance states for storing data; one or more reference cells corresponding to one or more storage cells of the plurality of storage cells, and including reference resistance elements for discriminating resistance values of variable resistance variable elements of the corresponding storage cells; and a data read circuit configured to receive read current flowing through a storage cell selected among the plurality of storage cells through a first input terminal, receive reference current flowing through a reference cell corresponding to the selected storage cell through a second input terminal, and compare the read current and the reference current during a comparison period, and, wherein the data read circuit further operates in the comparison period to decrease a driving force for driving the read current, from a first value to a read value smaller than the first value, and decrease a driving force for driving the reference current, from a second value to a reference value smaller than the second value.

In some implementations, the data read circuit may control the driving forces for driving the read current and the reference current in response to a first control voltage and a second control voltage, respectively, and lower the first control voltage from a first level to a read level lower than the first level and lower the second control voltage from a second level to a reference level lower than the second level.

In some implementations, an amount of the read current may converge to a value based on a resistance value of the resistance variable element of the selected storage cell, and an amount of reference current may converge to a value based on a resistance value of the reference resistance element of the reference cell corresponding to the selected storage cell.

In some implementations, if a resistance value of the resistance variable element of the selected storage cell is greater than a resistance value of the reference resistance element of the reference cell corresponding to the selected storage cell, an amount of the read current is smaller than an amount of the reference current.

In some implementations, if a resistance value of the resistance variable element of the selected storage cell is smaller than a resistance value of the reference resistance element of the reference cell corresponding to the selected storage cell, an amount of the read current is greater than an amount of the reference current.

In some implementations, the data read circuit may include: a current comparison block configured to compare the read current and the reference current; a read current control unit configured to control the read current in response to a voltage of a first node; a reference current control unit configured to control the reference current in response to a voltage of a second node; a first driving unit operates in a non-comparison period to drive the first node with a first voltage higher than a read voltage, and, operates in the comparison period to drive the first node with the read voltage; and a second driving unit operates in a non-comparison period to drive the second node with a second voltage higher than a reference voltage, and, operates in the comparison period to drive the second node with the reference voltage in the comparison period.

In some implementations, the variable resistance elements may include at least one of a metal oxide and a structure in which a tunnel barrier layer is interposed between two ferromagnetic layers.

In some implementations, the electronic device further comprises a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

In some implementations, the electronic device further comprises a microprocessor which includes: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

In some implementations, the electronic device further comprises a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

In some implementations, the electronic device further comprises a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

In some implementation, the electronic device may further include a memory system. The memory system include a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

Those and other aspects of the disclosed technology and their implementations and variations are described in greater detail in the drawings, the description and the claims.

DETAILED DESCRIPTION

Various examples and implementations of the disclosed technology are described below in detail with reference to the accompanying drawings.

Figure 1:
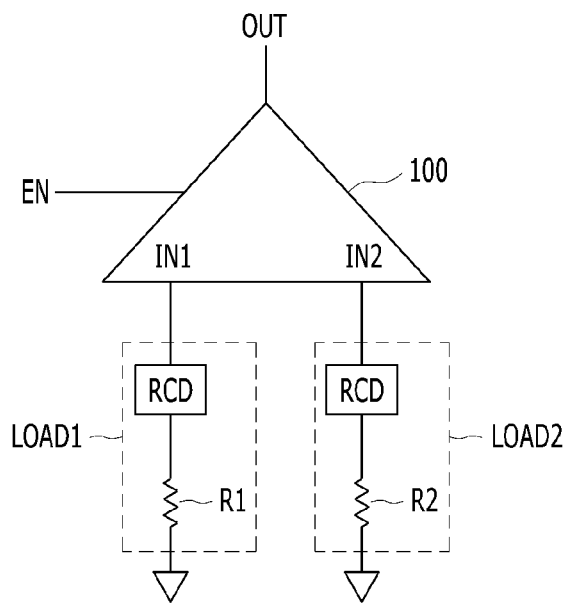
FIG. 1 is a representation of a conventional current comparator.

In electronic devices which can store data using a characteristic switched between different resistance states, a resistance state needs to be detected. As one example, a current comparator may be used to detect a resistance state of the device. FIG. 1 shows a conventional current comparator 100. Referring to FIG. 1, the current comparator 100 includes a first input terminal IN1, a second input terminal IN2, and an output terminal OUT. A first load LOAD1 may be electrically coupled to the first input terminal IN1, and a second load LOAD2 may be electrically coupled to the second input terminal IN2.

When an enable signal EN is activated, the current comparator 100 may compare an amount of current I1 flowing through the first input terminal IN1 and an amount of current I2 flowing through the second input terminal IN2, and may output a comparison result to the output terminal OUT. For example, the current comparator 100 may output a logic high level when the amount of current I1 flowing through the first input terminal IN1 is greater than the amount of current I2 flowing through the second input terminal IN2, and may output a logic low level when the amount of current I1 flowing through the first input terminal IN1 is smaller than the amount of current I2 flowing through the second input terminal IN2.

The amount of current I1 flowing through the first input terminal IN1 may be determined by the first load LOAD1, and the amount of current I2 flowing through the second input terminal IN2 may be determined by the second load LOAD2. Accordingly, the current comparator 100 which compares the first current I1 flowing through the first load LOAD1 via the first input terminal IN1 and the second current I2 flowing through the second load LOAD2 via the second input terminal IN2 may compare certain properties (for example, resistance values) of the first load LOAD1 and the second load LOAD2.

The first and second loads LOAD1 and LOAD2 may include RC delays RCD which are caused by various elements, for example, resistance R1 and R2, parasitic capacitance, and so forth. Due to the presence of the RC delays RCD, it takes predetermine times until the first and second currents I1 and I2 are stabilized. Such times required for stabilizing first and second currents I1 and I2 are referred to as settling times. If the settling times become longer, the current comparator 100 requires more time to perform a comparison operation. Increase time for the comparison operation in the current comparator 100, which is caused by RC delays and so forth, may affect the high speed operation of the electronic devices.

An electronic device in accordance with implementations may include a variable resistance element. In the following descriptions, a variable resistance element may exhibit a resistance variable characteristic and may include a single layer or a multi-layer. For example, a variable resistance element may include substances used in an RRAM, an MRAM, or an FRAM, etc., for example, a transition metal compound, a ferroelectric, or a ferromagnetic, and so on. However, other substances can be also used as long as a substance allows the variable resistance element to have a resistance variable characteristic that it can be switched between different resistance states according to a voltage or a current applied to the variable resistance element. The two resistance states can be used to store data, e.g., one state for digital bit "0" and another for digital bit "1" in representing digital data.

In one implementation, the variable resistance element may include a metal oxide. For example, the metal oxide may be or include a transition metal oxide such as a nickel (Ni) oxide, a titanium (Ti) oxide, a hafnium (Hf) oxide, a zirconium (Zr) oxide, a tungsten (W) oxide and a cobalt (Co) oxide or a perovskite-based substance such as STO (SrTiO)

or PCMO (PrCaMnO). The variable resistance element may exhibit a characteristic that it is switched between different resistance states due to creation and extinction of current filaments through behavior of vacancies.

Further, the variable resistance element may include a structure in which a tunneling barrier layer is interposed between two ferromagnetic layers. The ferromagnetic layers may be formed using a substance such as NiFeCo or CoFe, and the tunneling barrier layer may be formed using a substance such as Al2O3. The variable resistance element may exhibit a characteristic that it is switched between different resistance states according to magnetization directions of the ferromagnetic layers. For example, in the case where the magnetization directions of the two ferromagnetic layers are parallel to each other, the variable resistance element may be in a low resistant state, and, in the case where the magnetization directions of the two ferromagnetic layers are anti-parallel to each other, the variable resistance element may be in a high resistance state.

Figure 2:
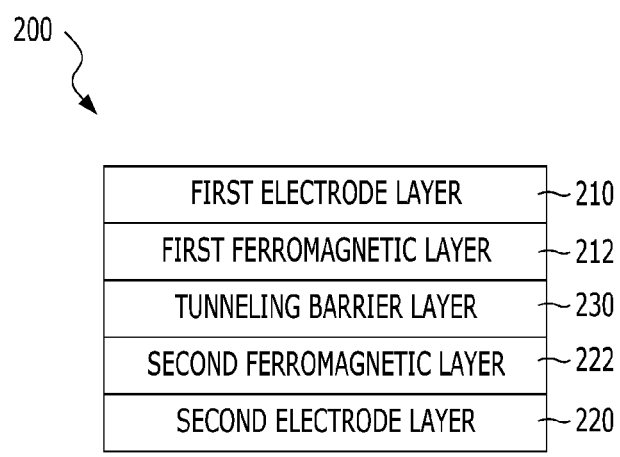
FIG. 2 is a diagram showing an example of a magnetic tunnel junction (MTJ) element as one of structures in which a tunneling barrier layer is interposed between two ferromagnetic layers.

FIG. 2 is a diagram showing an example of a magnetic tunnel junction (MTJ) element as one of structures in which a tunneling barrier layer is interposed between two ferromagnetic layers.

Referring to FIG. 2, an MTJ element 200 includes a first electrode layer 210 as a top electrode, a second electrode layer 220 as a bottom electrode, a first ferromagnetic layer 212 and a second ferromagnetic layer 222 as a pair of ferromagnetic layers, and a tunneling barrier layer 230 which is formed between the pair of ferromagnetic layers 212 and 222.

The first ferromagnetic layer 212 is or includes a free ferromagnetic layer of which magnetization direction may be changed according to a direction of current applied to the MTJ element 200, and the second ferromagnetic layer 222 is or includes a pinned ferromagnetic layer of which magnetization direction is pinned.

The MTJ element 200 operates to store a binary data bit of "0" or "1" as the resistance value is changed to a low value or a high value, respectively, according to a direction of current.

Figure 3A:
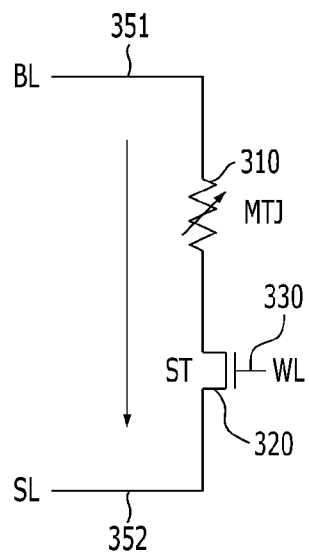
FIGS. 3A and 3B are views explaining a principle of storing data in a variable resistance element.
Figure 3B:
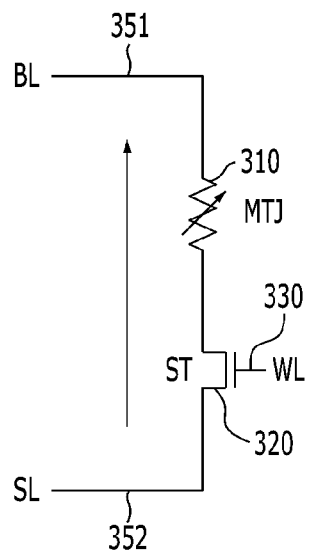

FIGS. 3A and 3B are views explaining a principle of storing data in a variable resistance element 310. The variable resistance element 310 may be or include the MTJ element 200 described above with reference to FIG. 2.

First, FIG. 3A is a diagram explaining a principle of recording data with a low logic value in the variable resistance element 310. In order to select the variable resistance element 310 in which data is to be stored, a word line 330 electrically coupled to the variable resistance element 310 is activated to turn on a transistor 320. As a current flows from one end 351 to the other end 352 (in the direction indicated by the arrow), that is, from the first electrode layer 210 as a top electrode to the second electrode layer 220 as a bottom electrode in the MTJ element 200 shown in FIG. 2, the magnetization direction of the first ferromagnetic layer 212 as a free ferromagnetic layer and the magnetization direction of the second ferromagnetic layer 222 as a pinned ferromagnetic layer become parallel to each other, and the variable resistance element 310 is in a low resistance state. When the variable resistance element 310 is in the low resistance state, it is defined that 'low' data is stored in the variable resistance element 310.

FIG. 3B is a diagram explaining a principle of recording data with a high logic value in the variable resistance element 310. In a similar manner, the word line 330 electrically coupled to the variable resistance element 310 is activated to turn on the transistor 320. As a current flows from the other end 352 to one end 351 (in the direction indicated by the arrow), that is, from the second electrode layer 220 to the first electrode layer 210 in the MTJ element 200 shown in FIG. 2, the magnetization direction of the first ferromagnetic layer 212 and the magnetization direction of the second ferromagnetic layer 222 become anti-parallel to each other, and the variable resistance element 310 is in a high resistance state. When the resistance variable element 310 is in the high resistance state, it is defined that 'high' data is stored in the variable resistance element 310.

Figure 4:
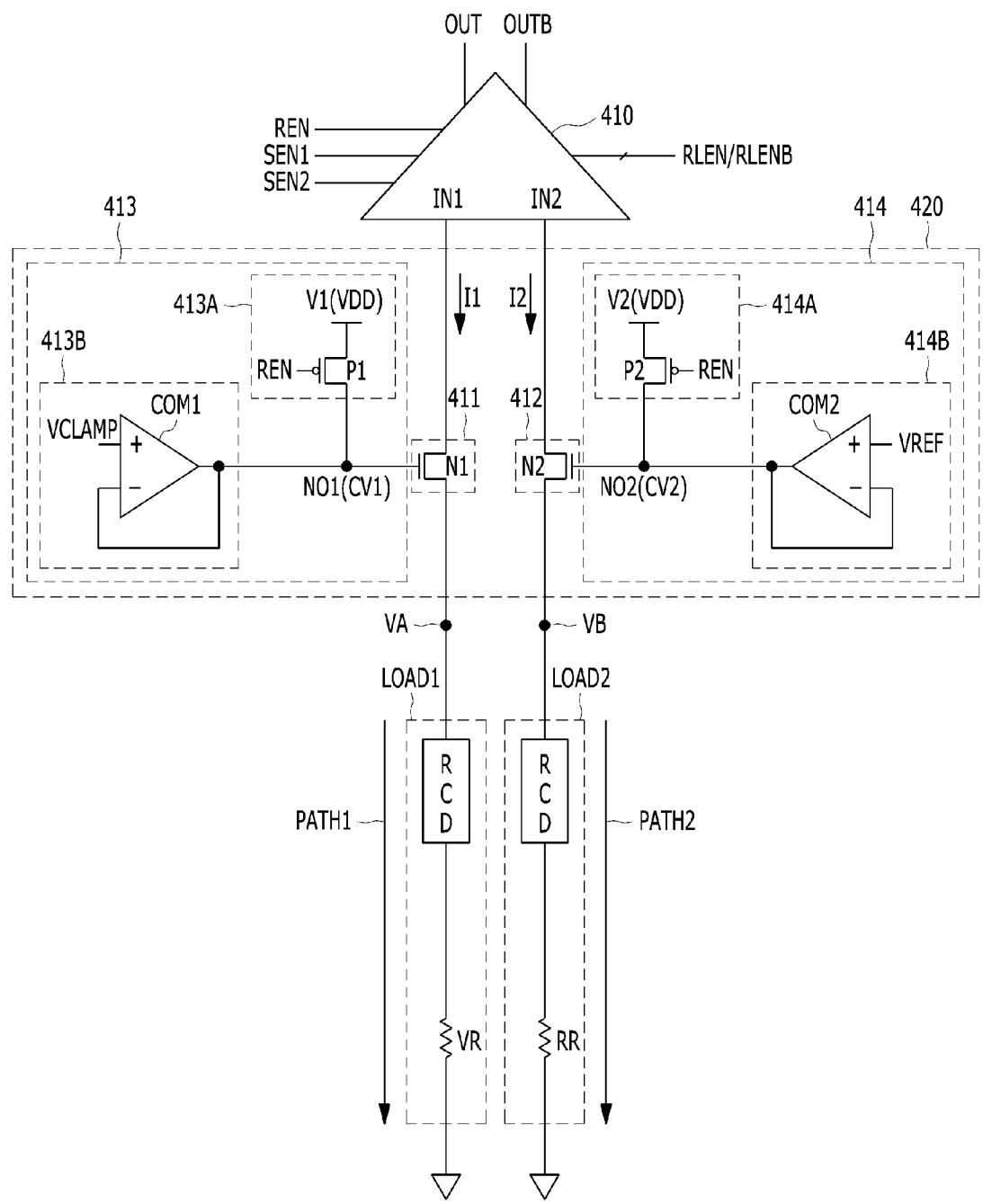
FIG. 4 is a configuration diagram illustrating an exemplary current comparator in accordance with an implementation.

FIG. 4 is a configuration diagram illustrating an exemplary current comparator in accordance with an implementation.

Referring to FIG. 4, the current comparator may include a current comparison block 410 and a current driving block 420. The current comparison block 410 may include a first input terminal IN1 and a second input terminal IN2. The current comparison block 410 may perform a current comparison operation during a comparison period.

The current driving block 420 may electrically couple the first input terminal IN1 with a first load LOAD1, and may electrically couple the second input terminal IN2 with a second load LOAD2. Also, during an activation period, the current driving block 420 may control an activation period an amount of first current I1 flowing through the first input terminal IN1 and the first load LOAD1, and an amount of second current I2 flowing through the second input terminal IN2 and the second load LOAD2.

During the comparison period, the current driving block 420 may control a first driving force for driving the first current I1, in response to a first control voltage CV1, and may control a second driving force for driving the second current I2, in response to a second control voltage CV2. The amount of the first current I1 may increase if the level of the first control voltage CV1 increases, and the amount of the first current I1 may decrease if the level of the first control voltage CV1 decreases. The amount of the second current I2 may increase if the level of the second control voltage CV2 increases, and the amount of the second current I2 may decrease if the level of the second control voltage CV2 decreases.

During a period except the comparison period, the current driving block 420 may maintain the first control voltage CV1 as a first level. During the comparison period, the current driving block 420 may lower the first control voltage CV1 from the first level to a read level lower than the first level. During a period except the comparison period, the current driving block 420 may maintain the second control voltage CV2 as a second level. During the comparison period, the current driving block 420 may lower the second control voltage CV2 from the second level to a reference level lower than the second level in the comparison period. In one implementation, the first level and the second level may correspond to the levels of a power supply voltage VDD.

In the comparison period, by lowering the levels of the first and second control voltages CV1 and CV2, the current driving block 420 may decrease the first driving force from a first value to a read value smaller than the first value and may decrease the second driving force from a second value to a reference value smaller than the second value, in the comparison period. The current driving block 420 has driving forces with the first value and the read value when the first control voltage CV1 has a first level VDD and a read level VCLAMP, respectively. The current driving block 420 has driving forces with the second value and the reference value when the second control voltages CV2 has a second level VDD and a reference level VREF.

The current driving block 420 may include a first current control unit 411, a second current control unit 412, a first driving unit 413, and a second driving unit 414. The first current control unit 411 may control the first current I1 in response to the first control voltage CV1, and the second current control unit 412 may control the second current I2 in response to the second control voltage CV2. The first control voltage CV1 is the voltage at a first node NO1, and the second control voltage CV2 is the voltage at a second node NO2.

The first driving unit 413 may drive the first node NO1 to a first voltage V1 higher than a read voltage VCLAMP, and may drive the first node NO1 to the read voltage VCLAMP in the comparison period. The second driving unit 414 may drive the second node NO2 to a second voltage V2 higher than a reference voltage VREF, and may drive the second node NO2 to the reference voltage VREF in the comparison period. The first and second voltages V1 and V2 may be the power supply voltage VDD.

The first driving unit 413 may include a first deactivation driving section 413A which drives the first node NO1 with the first voltage V1 when a read enable signal REN is deactivated, and a first activation driving section 413B which drives the first node NO1 with the read voltage VCLAMP when the read enable signal REN is activated. For reference, the read enable signal REN may be a signal which is activated for a predetermined period in the comparison period.

The first deactivation driving section 413A may include a transistor P1 having one end which is provided with the first voltage V1 and having the other end which is electrically coupled to the first node NO1. The transistor P1 is turned on or off in response to the read enable signal REN. The first activation driving section 413B may include a comparator COM1 which is activated in response to the read enable signal REN. The comparator COM1 pull-up drives the first node NO1 when the voltage of the first node NO1 is lower than the read voltage VCLAMP and pull-down drives the first node NO1 when the voltage of the first node NO1 is higher than the read voltage VCLAMP.

The second driving unit 414 may include a second deactivation driving section 414A and a second activation driving section 414B whose operations are similar to those of the first driving unit 413.

For reference, the read voltage VCLAMP and the reference voltage VREF may have predetermined levels to allow the corresponding transistors N1 and N2 to operate in a saturation mode. The predetermined levels of the read voltage VCLAMP and the reference voltage VREF may be higher than the threshold voltages of the transistors N1 and N2, respectively, and are lower than the power supply voltage VDD. The read voltage VCLAMP and the reference voltage VREF may be generated using voltage generators capable of continuously generating specified levels of voltages.

The current comparison block 410 may compare the amount of the first current I1 and the amount of the second current I2 in the comparison period, and may output a comparison result as output values OUT and OUTB. For example, the current comparison block 410 may output the output values OUT and OUTB as a logic low level and a logic high level, respectively, when the amount of the first current I1 is greater than the amount of the second current I2, and may output the output values OUT and OUTB as a logic high level and a logic low level, respectively, when the amount of the first current I1 is smaller than the amount of the second current I2. However, other implementations are also possible regarding logic values provided by the current comparison block 410. For example, depending on a design of the comparator, the current comparison block 410 outputs the output values OUT and OUTB as a logic high level and a logic low level when the first current I1 is greater than the second current I2, and the current comparison block 410 outputs the output values OUT and OUTB as a logic low level and a logic high level when the first current I1 is smaller than the second current I2. During a period except the comparison period, the first current I1 and second current I2 may be blocked.

The first load LOAD1 may be applied to a first current path PATH1 including a variable resistance element VR, and the second load LOAD2 may be applied to a second current path PATH2 including a reference resistance element RR. The variable resistance element VR may have a first resistance value or a second resistance value higher than the first resistance value, according to a state. The reference resistance element RR may have a resistance value between the first resistance value and the second resistance value to discriminate the resistance value of the variable resistance element VR. The relationship between the resistance values of the first load LOAD1 and the second load LOAD2 may be the same as the relationship between the resistance values of the variable resistance element VR and the reference resistance element RR. For example, the resistance value of the first load LOAD1 may be smaller than the resistance value of the second load LOAD2 when the variable resistance element VR has the first resistance value smaller than the resistance value of the reference resistance element RR, and the resistance value of the first load LOAD1 may be greater than the resistance value of the second load LOAD2 when the variable resistance element VR has the second resistance value greater than the resistance value of the reference resistance element RR, and the first and second paths PATH1 and PATH2 may include capacitance components such as parasitic capacitance, and thus, may cause RC delays RCD. In order to stabilize the amounts of the first and second current I1 and I2, the transistors N1 and N2 needs to have certain value of the differences between voltages at sources and gates of the transistors N1 and N2. For example, the difference between the first control voltage CV1 and the voltage V1 and the difference between the second control CV2 and the voltage VB may have the same value. Since the first and second control voltages CV1 and CV2 are stabilized to the levels of the read voltage VCLAMP and the reference voltage VREF, respectively, in the comparison period, the amounts of the first and second currents I1 and I2 may be stabilized when the levels of the voltages VA and VB are stabilized. The voltages VA and VB may be stabilized when charges are appropriately charged to the capacitance components respectively present in the first and second loads LOAD1 and LOAD2, by the first and second current I1 and I2.

Hereafter, operations of the current comparator for comparing current and outputting a comparison result will be further described.

In a period except the comparison period, the first node NO1 is driven with the first voltage V1 and the first control voltage CV1 is retained at the same level as the first voltage V1, and the second node NO2 is driven with the second voltage V2 and the second control voltage CV2 is retained at the same level as the second voltage V2. The first and second currents I1 and I2 do not flow through the first and second input terminals IN1 and IN2.

Upon entering the comparison period, as the read enable signal REN is activated, the first node NO1 is driven with the read voltage VCLAMP, and the second node NO2 is driven with the reference voltage VREF. The voltage level of the first node NO1 gradually falls from the first voltage V1 and reaches the read voltage VCLAMP, and the voltage level of the second node NO2 gradually falls from the second voltage V2 and reaches the reference voltage VREF.

As the first and second control voltages CV1 and CV2 decrease from higher levels to the read voltage VCLAMP and reference voltage VREF, respectively, the amounts of the first and second current I1 and I2 abruptly increase from the time when the read enable signal REN is activated and then gradually decrease. The first current I1 converges to a value corresponding to the resistance value of the first load LOAD1, and the second current I2 converges to a value corresponding to the resistance value of the second load LOAD2.

The amounts of the first and second current I1 and I2 may decrease as the resistance values of the first and second loads LOAD1 and LOAD2 increase, and may increase as the resistance values of the first and second loads LOAD1 and LOAD2 decrease. Times required from when the read enable signal REN is activated to when the amounts of the first and second currents I1 and I2 are stabilized may be referred to as settling times.

In the comparison period, the current comparison block 410 compares the amount of the first current I1 with and the amount of the second current I2 and outputs the comparison result. Since the amounts of the first and second current I1 and I2 respectively correspond to the resistance values of the first and second loads LOAD1 and LOAD2 and the resistance values of the first and second loads LOAD1 and LOAD2 respectively correspond to the resistance values of the resistance variable element VR and the reference resistance element RR, it is possible to discriminate which one between the resistance values of the resistance variable element VR and the reference resistance element RR is greater than the other by using comparison results OUT and OUTB of the current comparison block 410. The detailed configuration and operation of the current comparison block 410 will be described below with reference to FIG. 5.

When entering the comparison period, in the current comparator of FIG. 4, the amounts of the first and second current I1 and I2 are increased using the first and second control voltages CV1 and CV2 with high levels. Thus, it is possible to shorten settling times required for appropriately charging the capacitance components included in the first and second loads LOAD1 and LOAD2. Accordingly, time spent for performing a comparison operation can be reduced. That is, the speed of the comparison operation may be elevated.

Figure 5:
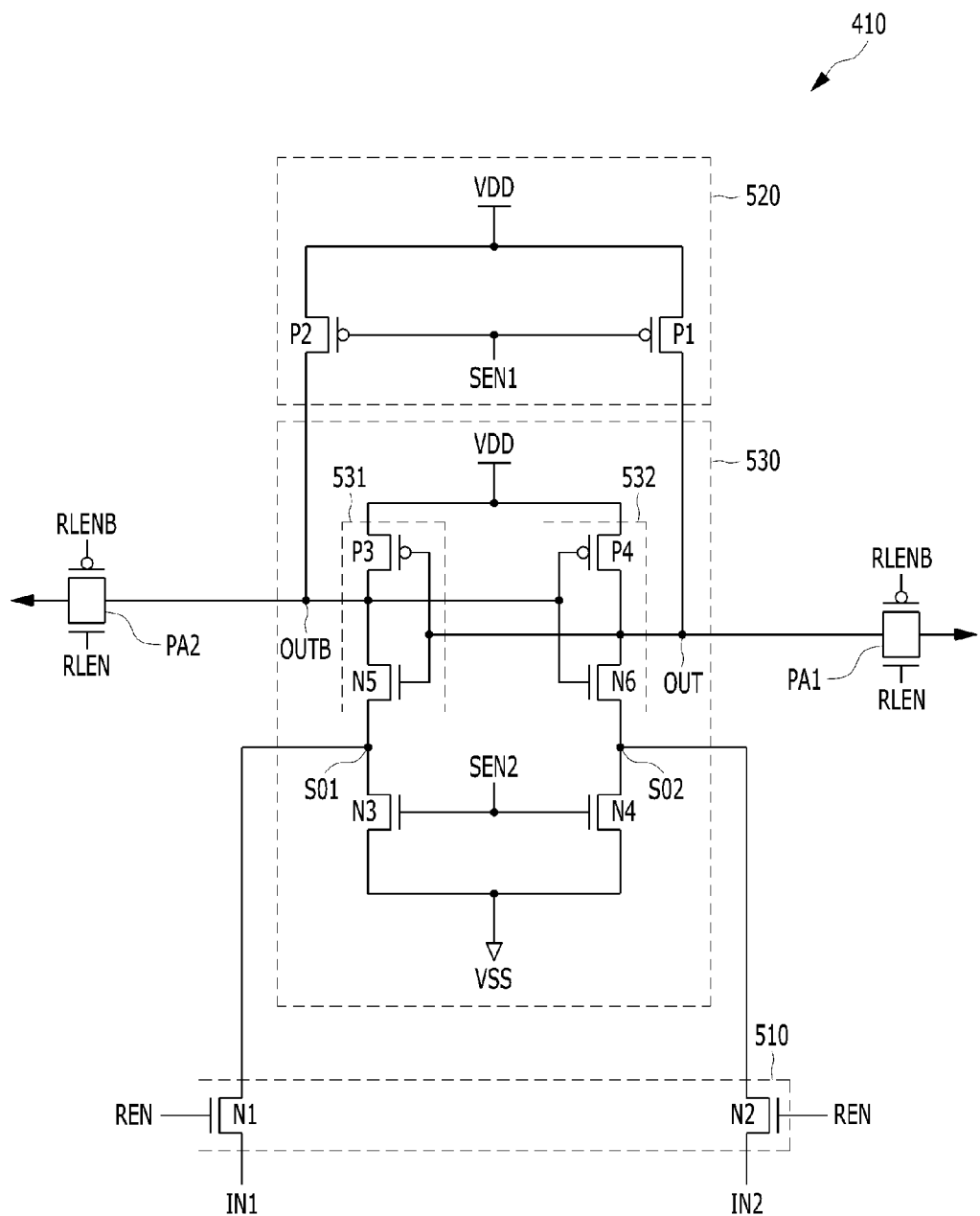
FIG. 5 is a configuration diagram illustrating an example of the current comparison block shown in FIG. 4.

FIG. 5 is a configuration diagram illustrating an exemplary current comparison block 410 shown in FIG. 4.

Referring to FIG. 5, the current comparison block 410 may include a coupling unit 510, a precharge unit 520, and an amplification unit 530.

The coupling unit 510 may be arranged to electrically coupled the first input terminal IN1 with a first sensing node SO1, and electrically couple the second input terminal IN2 with a second sensing node SO2. The coupling unit 510 may electrically couple the first and second sensing nodes SO1 and SO2 with the first and second input terminals IN1 and IN2, respectively, when the read enable signal REN is activated.

The coupling unit 510 may include a transistor N1 and a transistor N2. The transistor N1 is arranged between the first input terminal IN1 and the first sensing node SO1 and is turned on or off in response to the read enable signal REN. The transistor N2 is arranged between the second input terminal IN2 and the second sensing node SO2 and is turned on or off in response to the read enable signal REN.

The precharge unit 520 may precharge the first sensing node S01, the second sensing node SO2, a first output node OUT and a second output node OUTB during a period in which a first sensing signal SEN1 is deactivated. The first sensing signal SEN1 may be activated for a preselected period after the read enable signal REN is activated in the comparison period. During the period in which the first sensing signal SEN1 is deactivated, the power supply voltage VDD may be supplied to the first and second output nodes OUT and OUTB. Accordingly, the voltages of the first and second output nodes OUT and OUTB are precharged with the power supply voltage VDD. Thus, when the read enable signal REN is deactivated, the first and second sensing nodes SO1 and SO2 may be precharged with the power supply voltage VDD.

The precharge unit 520 may include a transistor P1 and a transistor P2. The transistor P1 has one end supplied with the power supply voltage VDD and the other end electrically coupled to the first output node OUT. The transistor P1 is turned on or off in response to the first sensing signal SEN1. The transistor P2 has one end applied with the power supply voltage VDD and is the other end electrically coupled to the second output node OUTB. The transistor P2 is turned on or off in response to the first sensing signal SEN1.

In an activation period, the amplification unit 530 may amplify the voltage difference between the first and second sensing nodes SO1 and SO2 and output the amplified voltage difference to the first and second output nodes OUT and OUTB. If the read enable signal REN is activated, the first current I1 may flow through the first sensing node SO1, and the second current I2 may flow through the second sensing node SO2. If the first sensing signal SEN1 is activated, precharge by the precharge unit 520 may be interrupted. Thus, the first sensing node SO1 may be discharged by the first current I1 and the voltage of the first sensing node SO1 may gradually fall. Further, the second sensing node SO2 may be discharged by the second current I2 and the voltage of the second sensing node SO2 may gradually fall.

The voltage drop proceeds more quickly for a sensing node through which the greater of the first and second current I1 and I2 flows. If a second sensing signal SEN2 is activated, the amplification unit 530 may be activated, and the voltage difference between the first and second sensing nodes SO1 and SO2 may be amplified and outputted to the first and second output nodes OUT and OUTB. In the case of the amplification unit 530 of FIG. 5, if the amount of the first current I1 is greater than the amount of the second current I2, a logic low level and a logic high level may be outputted to the first and second output nodes OUT and OUTB, If the amount of the first current I1 is smaller than the amount of the second current I2, a logic high level and a logic low level may be outputted to the first and second output nodes OUT and OUTB.

The amplification unit 530 may include a transistor N3 and a transistor N4. The transistor N3 has one end which is supplied with a ground voltage VSS and the other end which electrically couples to the first sensing node NO1. The transistor N3 is turned on or off in response to the second sensing signal SEN2. The transistor N4 has one end which is supplied with the ground voltage VSS and the other end which electrically couples to the second sensing node SO2.

The transistor N4 is turned on or off in response to the second sensing signal SEN2. The amplification unit 530 may include a driving section 531 and a driving section 532. The driving section 531 operates by being supplied with the power supply voltage VDD and the voltage of the first sensing node SO1 and drives the second output node OUTB in response to the voltage of the first output node OUT. The driving section 532 operates by being supplied with the power supply voltage VDD and the voltage of the second sensing node SO2 and drives the first output node OUT in response to the voltage of the second output node OUTB. The driving sections 531 and 532 may include transistors N5, P3, N6 and P4.

The resultant values of the first and second output nodes OUT and OUTB may be outputted through corresponding pass gates PA1 and PA2, respectively, when output signals RLEN and RLENB are activated. The output signal RLEN may be activated for a predefined period after the second sensing signal SEN2 is activated. The output signal RLENB may be or include an inverted signal of the output signal RLEN. If sensing is completed, the signals REN, SEN1 and SEN2 may be deactivated in a predetermined order, and an activation period may be ended.

Figure 6:
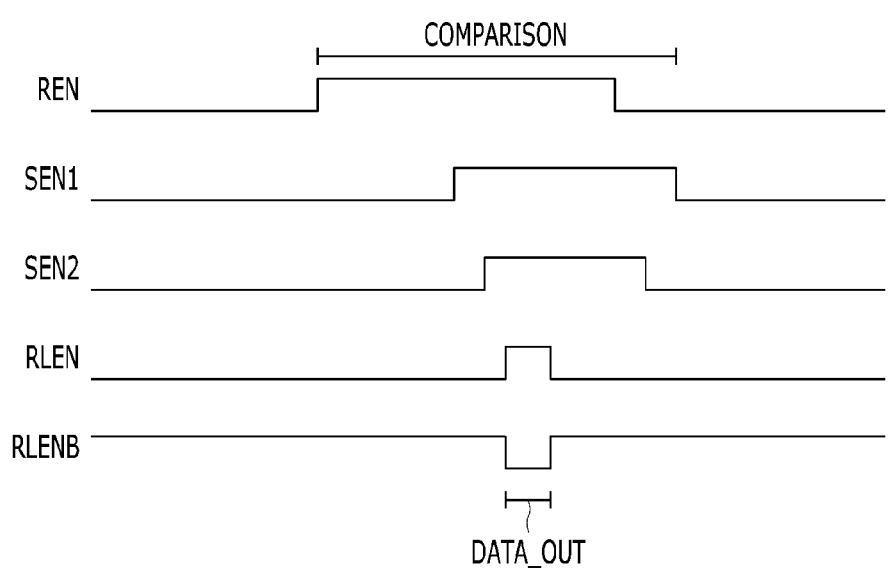
FIG. 6 shows an exemplary waveform diagram of various signals used to operate the current comparator shown in FIG. 4.

FIG. 6 shows an exemplary waveform diagram showing various signals used to operate the current comparator shown in FIG. 4.

FIG. 6 shows the waveforms of the read enable signal REN, the first sensing signal SEN1, the second sensing signal SEN2, and the output signals RLEN and RLENB. Hereafter, the current comparison operation of the current comparator will be described with reference to FIGS. 4 to 6.

During a period except a comparison period COMPARISON, the read enable signal REN, the first sensing signal SEN1, the second sensing signal SEN2 and the output signals RLEN and RLENB are all in deactivated states. In this case, the first and second currents I1 and I2 do not flow through the first and second input terminals IN1 and IN2, and the first and second sensing nodes SO1 and SO2 are in the state in which they are precharged with the power supply voltage VDD.

If the comparison period COMPARISON starts and the read enable signal REN is activated, the first and second currents I1 and I2 flow through the first and second input terminals IN1 and IN2. If the first sensing signal SEN1 is activated after a preset time, precharge is interrupted, and the voltages of the first and second sensing nodes SO1 and SO2 fall. Thereafter, if the second sensing signal SEN2 is activated, the amplification unit 530 is activated, and the voltage difference between the first and second sensing nodes SO1 and SO2 is amplified and then outputted through the first and second output nodes OUT and OUTB.

In the case where the amount of the first current I1 is greater than the amount of the second current I2, the first and second output nodes OUT and OUTB may respectively have the ground voltage VSS and the power supply voltage VDD. In the case where the amount of the first current I1 is smaller than the amount of the second current I2, the first and second output nodes OUT and OUTB may respectively have the power supply voltage VDD and the ground voltage VSS. Such voltages of the output nodes OUT and OUTB may be outputted as outputs DATA_OUT during a period in which the output signals RLEN and RLENB are activated.

Once the comparison result of current amounts is outputted, the read enable signal REN is deactivated. Then, the first and second sensing signals SEN1 and SEN2 are deactivated, and the comparison period COMPARISON may be ended.

Figure 7:
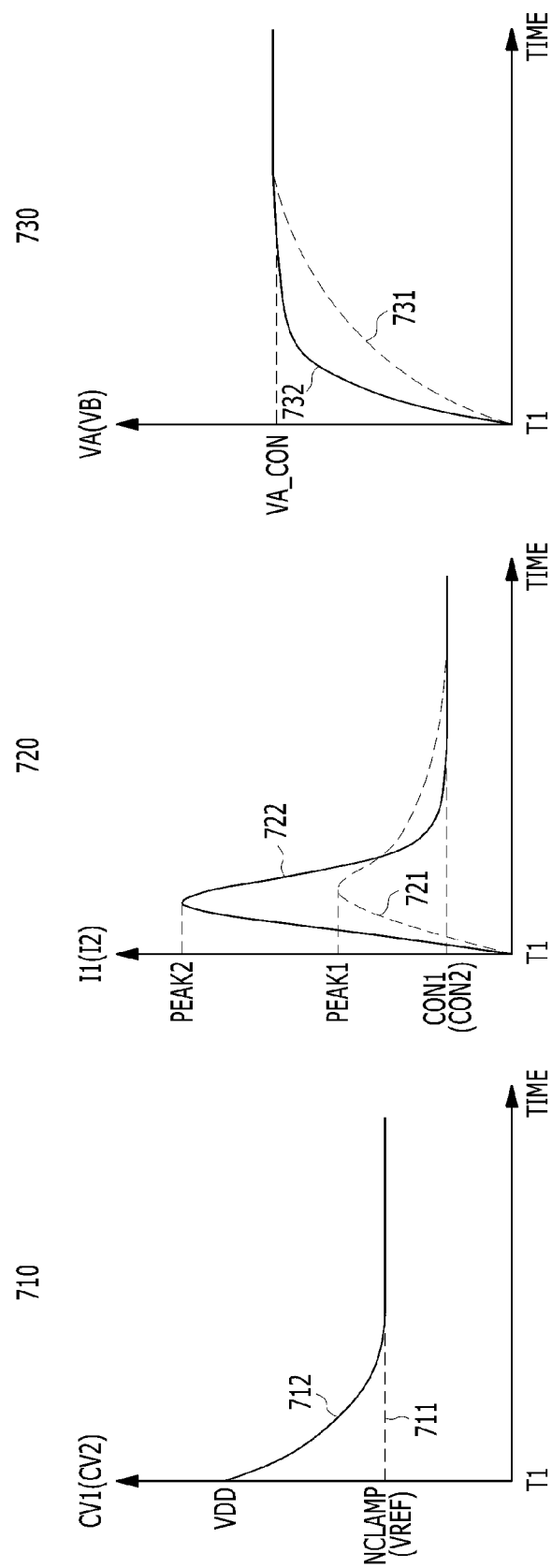
FIG. 7 illustrates exemplary graphs showing the effects of the current comparator shown in FIG. 4.

FIG. 7 illustrates exemplary graphs showing the effects of the current comparator shown in FIG. 4.

Referring to FIG. 7, a first graph 710 is a graph that shows the first control voltage CV1, a second graph 720 is a graph that shows the first current I1, and a third graph 730 is a graph that shows the voltage VA. In the first to third graphs 710, 720 and 730, the dotted lines 711, 721 and 731 show the waveforms obtained in a current comparator not using the disclosed technology, and the solid lines 712, 722 and 732 show the waveforms obtained in the current comparator of FIG. 4 using the disclosed technology.

As shown in the first graph 710, in the case not using the disclosed technology, the first control voltage CV1 may be retained constantly at the level of the read voltage VCLAMP (see the reference numeral 711). In the case of the current comparator of FIG. 4, the first control voltage CV1 may start to gradually fall from the level of the power supply voltage VDD at time T1 when the read enable signal REN is activated, and then reach the level of the read voltage VCLAMP (see the reference numeral 712).

As shown in the second graph 720, in the case of not using the disclosed technology, the amount of the first current I1 may reach a lower peak PEAK1 after a predefined time passes from the time T1 and then converge to a current amount CON1 that is determined based on the resistance value of the resistance variable element VR. In the case of the current comparator of FIG. 4, since the level of the first control voltage CV1 starts from the level of the power supply voltage VDD, the amount of the first current I1 may reach a higher peak PEAK2 after the predefined time passes from the time T1 and then converge to the current amount CON1 that is determined based on the resistance value of the resistance variable element VR.

As shown in the third graph 730, in the case of not using the disclosed technology, the voltage VA may converge to a predetermined level VA_CON relatively slowly. In the case of the current comparator of FIG. 4, the voltage VA may converge to the predetermined level VA_CON more quickly than in the case not using the disclosed technology. The level of the voltage VA may be proportional to the area bounded by each of the waveforms 721 and 722 of the first current I1 in the second graph 720.

While the waveforms of the second control voltage CV2, the second current I2 and the voltage VB have substantially the same shape as the first control voltage CV1, the first current I1 and the voltage VA shown in the first to third graphs 710, 720 and 730, the waveforms of the second control voltage CV2, the second current I2 and the voltage VB are converged to VREF, CON2 and VB_CON. The convergence values CON1 and CON2 of the first and second current I1 and I2 may be CON1<CON2 when VR>RR and may be CON1>CON2 when VR<RR.

Figure 8:
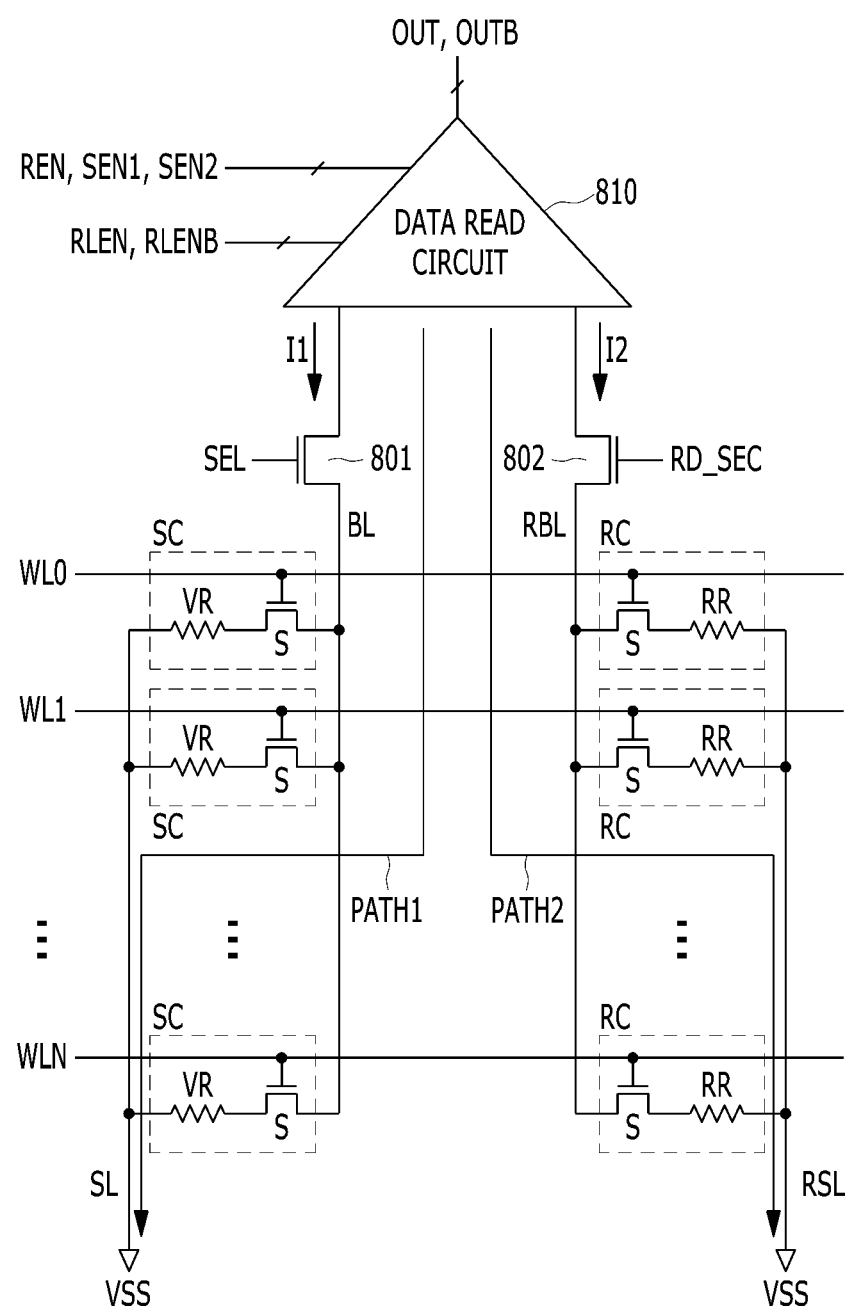
FIG. 8 is a configuration diagram illustrating a representation of an example of a memory circuit (device) including variable resistance elements in accordance with an implementation.

FIG. 8 is a configuration diagram illustrating an exemplary memory circuit (device) including variable resistance elements in accordance with an implementation of the disclosed technology.

Referring to FIG. 8, the memory circuit (device) may include a plurality of storage cells SC, one or more reference cells RC, and a data read circuit 810.

The storage cells SC may be arranged between a source line SL and a bit line BL. The storage cells SC electrically couple with the source line SL and the bit line BL, and may be electrically coupled with corresponding word lines of a plurality of word lines WL0 to WLN. The source line SL, the bit line BL and the storage cells SC electrically coupled between the source line SL and the bit line BL form one column, and the respective word lines WL0 to WLN coupling with the storage cells SC form rows. While FIG. 8 illustrates the memory circuit including one column, other implementations are also possible such that the memory circuit may include a plurality of columns. The reference cells RC may be arranged between a source line RSL and a bit line RBL to electrically couple with the source line RSL and the bit line RBL, and may be electrically coupled with corresponding word lines of the plurality of word lines WL0 to WLN.

Each of the storage cells SC may include a variable resistance element VR and a selection element S which is electrically coupled in series with the variable resistance element VR. Each of the reference cells RC may include a reference resistance element RR and a selection element S which is electrically coupled in series with the reference resistance element RR.

The storage cells SC may operate to store data, and the reference cells RC may operate to generate reference current I2 to be used for reading data. The variable resistance element VR may be in a low resistance state when low data is stored therein and may be in a high resistance state when high data is stored therein. However, other implementations are also possible. For example, the variable resistance element VR may be in a low resistant state when high data is stored therein and may be in a high resistant state when low data is stored therein. Hereinbelow, the read operation of the memory circuit will be described for the former case as an example. The reference resistance element RR may have a resistance value between the resistance value of the low resistance state and the resistance value of the high resistance state of the resistance variable element VR.

The data read circuit 810 may compare the resistance value of a storage cell SC selected in a read period (corresponding to the comparison period described above) with the resistance value of a reference cell RC corresponding to the selected storage cell SC. By doing so, the data read circuit 810 may read the data stored in the selected storage cell SC and output a reading result as output values OUT and OUTB. The data read circuit 810 may include the current comparator of FIG. 4.

The data reading operation of the data read circuit 810 is the same as the comparison operation of the current comparator described above with reference to FIGS. 4 to 6. The first load LOAD1 described above with reference to FIG. 4 may represent the load of a path through which read current (corresponding to the first current I1 of FIG. 4) flows, and the second load LOAD2 described above with reference to FIG. 4 may represent the load of a path through which reference current (corresponding to the second current I2 of FIG. 4) flows.

The column including the storage cells SC may be electrically coupled with the data read circuit 810 through a switch 801, and the column including the reference cells RC may be electrically coupled with the data read circuit 810 through a switch 802. The switch 801 may be turned on in response to a select signal SEL which is activated in the read period when the corresponding column is selected, and the switch 802 may be turned on in response to a read period signal RD_SEC which is activated in the read period. Moreover, a word line corresponding to the selected row may be activated (to a logic high level) among the word lines, and the remaining word lines may be deactivated (to a logic low level).

The read operation will be described on the assumption that the column including the storage cells SC is selected in the read period and the storage cell SC corresponding to the word line WL1 is selected. If the select signal SEL and the read period signal RD_SEC are activated and the word line WL1 is activated, read current I1 flows from the data read circuit 810 through the bit line BL, the storage cell SC corresponding to the word line WL1 and the source line SL (this current path of read current I1 corresponds to the first current path PATH1 of FIG. 4), and reference current I2 flows from the data read circuit 810 through the bit line RBL, the reference cell RC corresponding to the word line WL1 and the source line RSL (this current path of reference current I2 corresponds to the second current path PATH2 of FIG. 4). Since the data read circuit 810 can drive strong currents as the read current I1 and the reference current I2 upon entering the read period, the peaks of the read current I1 and the reference current I2 are high and thus, such currents may be quickly stabilized.

If the resistance value of the variable resistance element VR of the storage cell SC corresponding to the word line WL1 is smaller than the reference resistance element RR corresponding to the word line WL1, the amount of the read current I1 may be greater than the amount of the reference current I2, and the data read circuit 810 may output a logic high level and a logic low level as the outputs OUT and OUTB, respectively. In the opposite case, the amount of the read current I1 may be smaller than the amount of the reference current I2, and the data read circuit 810 may output a logic low level and a logic high level as the outputs OUT and OUTB, respectively.

Since the data read circuit 810 of the memory circuit of FIG. 8 includes the current comparator of FIG. 4 which has a high current comparison speed, the speed of the read operation may be also increased.

As is apparent from the above descriptions, in the current comparator in accordance with the implementations, as the settling times of comparison target current are shortened, the comparison speed may be elevated.

Further, in an electronic device using the current comparator in accordance with the implementations, since a time for discriminating the data of a storage cell is shortened, the operation speed may be elevated.

The above and other memory circuits or semiconductor devices based on the disclosed technology can be used in a range of devices or systems. FIGS. 9-13 provide some examples of devices or systems that can implement the memory circuits disclosed herein.

Figure 9:
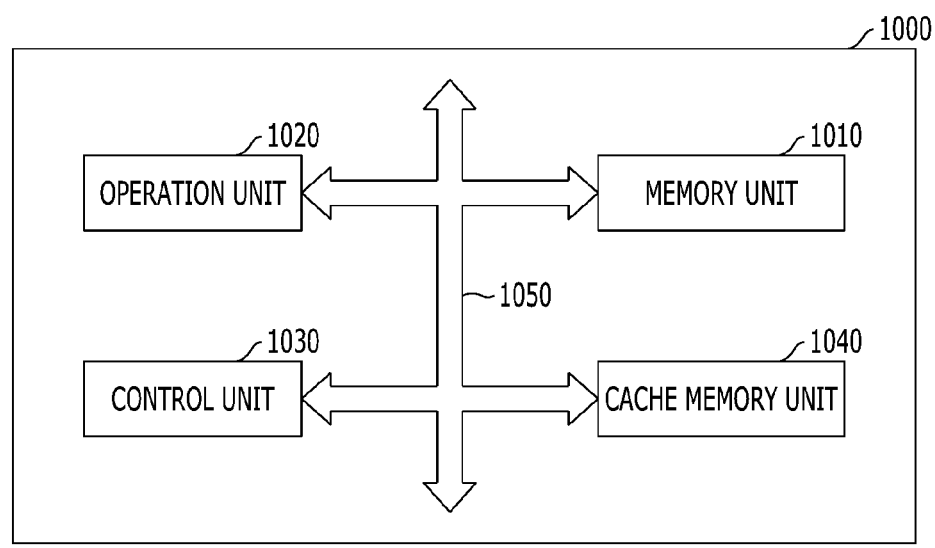
FIG. 9 shows an example of a configuration diagram of a microprocessor implementing memory circuitry based on the disclosed technology.
Figure 10:
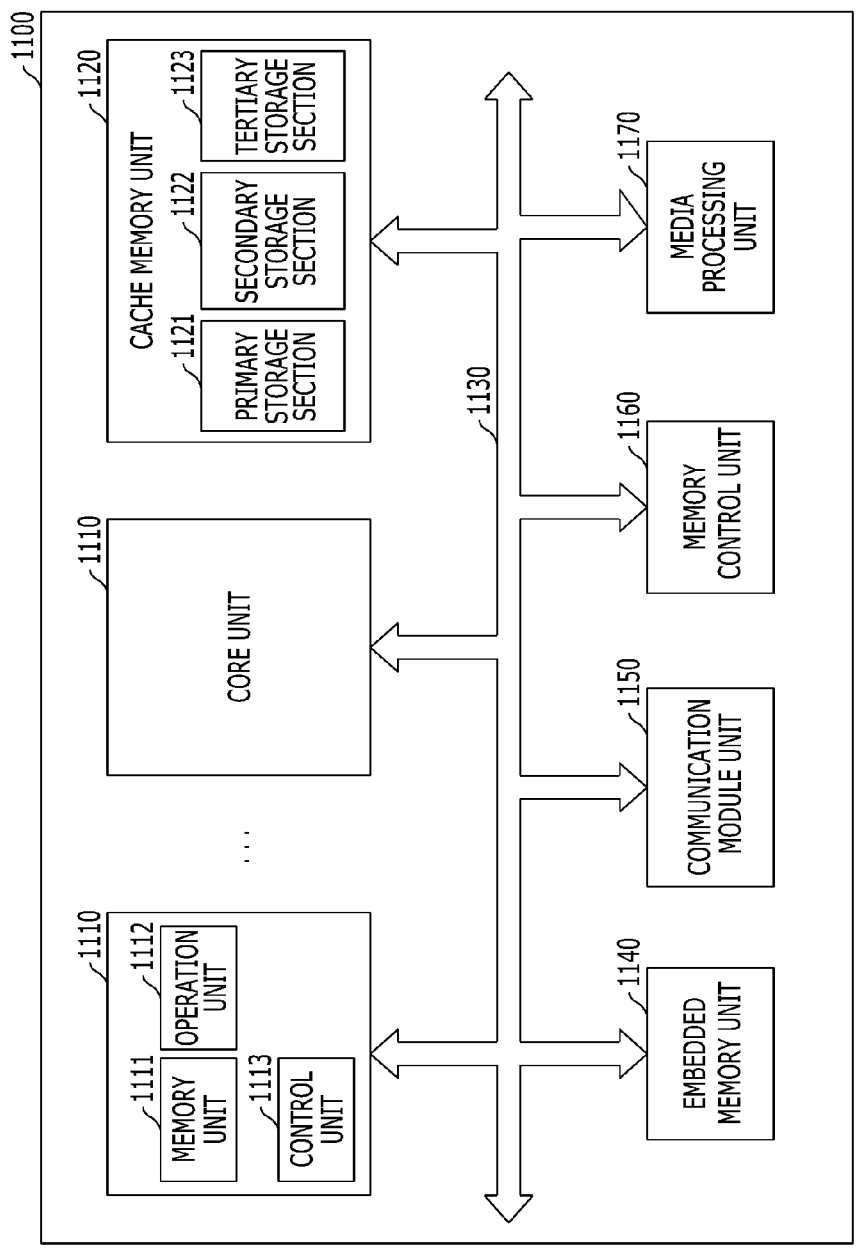
FIG. 10 shows an example of a configuration diagram of a processor implementing memory circuitry based on the disclosed technology.
Figure 11:
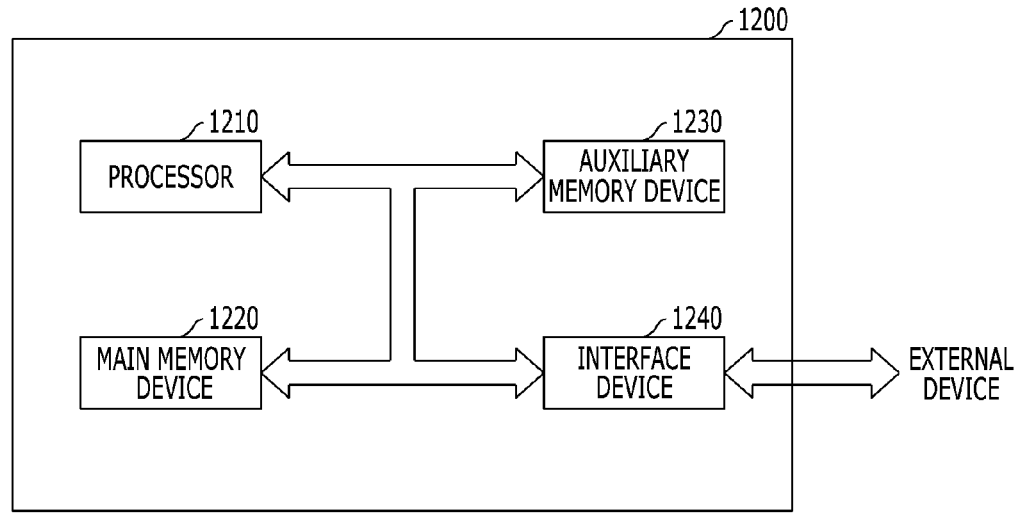
FIG. 11 shows an example of a configuration diagram of a system implementing memory circuitry based on the disclosed technology.

In FIGS. 9-11, a memory device (e.g., memory unit 1010 in FIG. 9, cache memory unit 1120 in FIG. 10, etc.) may be configured based on the disclosed technology to achieve one or more desired benefits. For example, in one implementation, such a memory device may include: a plurality of storage cells, each including a variable resistance element exhibiting different resistance states for storing data; one or more reference cells corresponding to one or more storage cells of the plurality of storage cells, and including reference resistance elements for discriminating resistance values of variable resistance variable elements of the corresponding storage cells; and a data read circuit configured to receive read current flowing through a storage cell selected among the plurality of storage cells through a first input terminal, receive reference current flowing through a reference cell corresponding to the selected storage cell through a second input terminal, and compare the read current and the reference current during a comparison period, and, wherein the data read circuit further operates in the comparison period to decrease a driving force for driving the read current, from a first value to a read value smaller than the first value, and decrease a driving force for driving the reference current, from a second value to a reference value smaller than the second value. Based on this construction of the memory unit, a read speed of the memory unit may be increased. Consequently, performance of the device or system using such a memory unit may be improved.

FIG. 9 shows an example of a configuration diagram of a microprocessor based on another implementation of the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described semiconductor devices in accordance with the implementations. For example, the memory unit 1010 may include: a plurality of storage cells and one or more reference cells based on the disclosed technology to improve the performance of the memory unit 1010, e.g., increasing its read speed. Consequently, performance of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

FIG. 10 is a configuration diagram of a processor based on another implementation of the disclosed technology.

Referring to FIG. 10, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described semiconductor devices in accordance with the implementations. For example, the cache memory unit 1120 may include a plurality of storage cells and one or more reference cells based on the disclosed technology to improve the performance of the cache memory unit 1120, e.g., increasing its read speed. Consequently, performance of the processor 1100 may be improved.

Although it was shown in FIG. 10 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

FIG. 11 is a configuration diagram of a system based on another implementation of the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a plurality of storage cells and reference resistance elements based on the disclosed technology to improve the performance of the memory unit 1220, e.g., increasing its read speed. Consequently, performance of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a plurality of storage cells including resistance variable elements and one or more reference cells corresponding to one or more storage cells of the plurality of storage cells and reference resistance elements based on the disclosed technology to improve the performance of the memory unit 1230, e.g., increasing its read speed. Consequently, performance of the system 1200 may be improved.

Also, the auxiliary memory device 1230 may further include a data storage system (see the reference numeral 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 12:
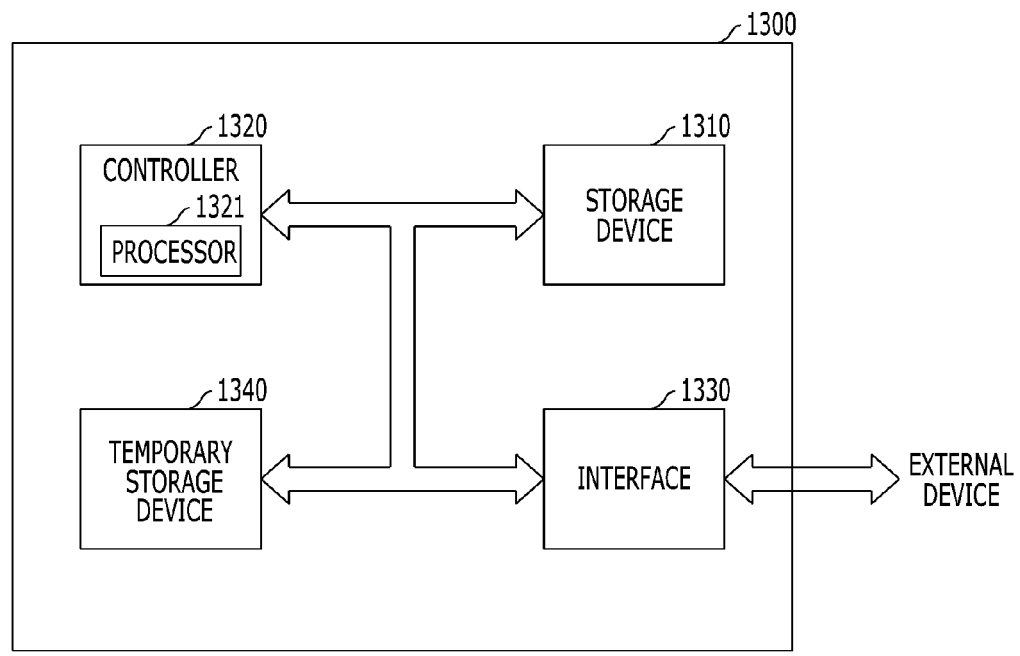
FIG. 12 shows an example of a configuration diagram of a data storage system implementing memory circuitry based on the disclosed technology.

FIG. 12 is a configuration diagram of a data storage system based on another implementation of the disclosed technology.

Referring to FIG. 12, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily implementation for efficiently transferring data between the interface 1330 and the storage device 1310 according to diversifications and high performance of an interface with an external device, a controller and a system. For example, the temporary storage device 1340 may include a plurality of storage cells including resistance variable elements and one or more reference cells corresponding to one or more storage cells of the plurality of storage cells based on the disclosed technology to improve the performance of the memory unit 1340, e.g., increasing its read speed. Consequently, performance of the data storage system 1300 may be improved.

Figure 13:
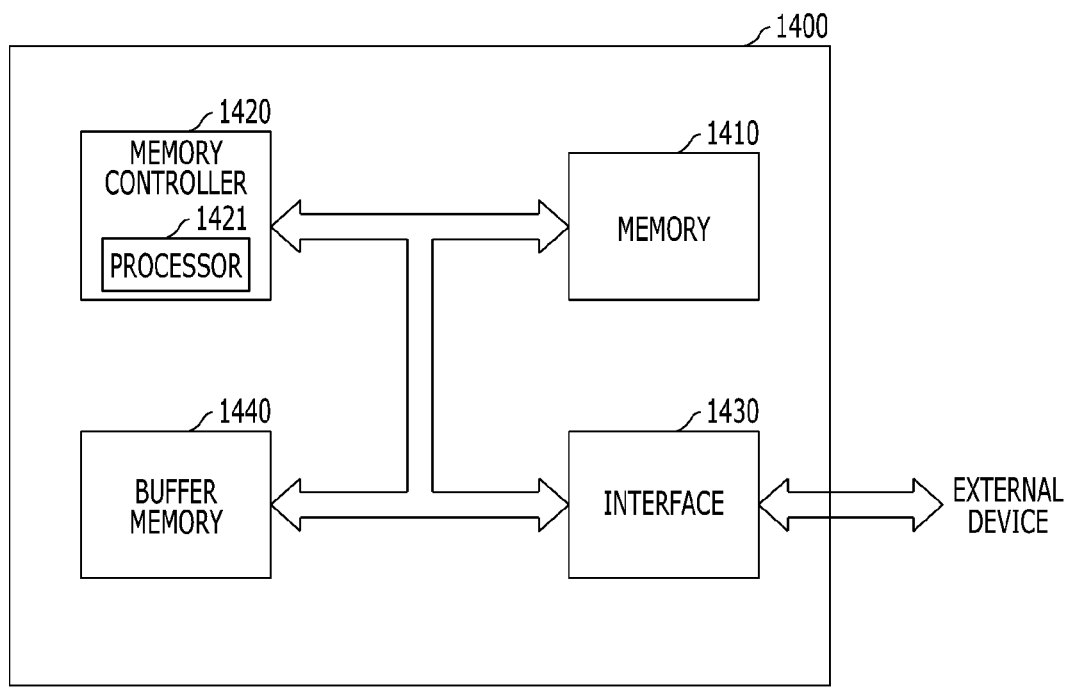
FIG. 13 shows an example of a configuration diagram of a memory system implementing memory circuitry based on the disclosed technology.

FIG. 13 is a configuration diagram of a memory system based on another implementation of the disclosed technology.

Referring to FIG. 13, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include a plurality of storage cells including resistance variable elements and one or more reference cells corresponding to one or more storage cells of the plurality of storage cells and reference resistance elements based on the disclosed technology to improve the performance of the memory 1410, e.g., increasing its read speed. Consequently, performance of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include a plurality of storage cells including resistance variable elements and one or more reference cells corresponding to one or more storage cells of the plurality of storage cells, and reference resistance elements based on the disclosed technology to improve the performance of the buffer memory 1440, e.g., increasing its read speed. Consequently, performance of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 9-13 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A current comparator comprising:
a current comparison block configured to compare current flowing through first and second input terminals;
a first current control unit configured to control current flowing through the first input terminal in response to a voltage of a first node;
a second current control unit configured to control current flowing through the second input terminal in response to a voltage of a second node;
a first driving unit configured to drive the first node with a first voltage higher than a read voltage in a non-comparison period, and drive the first node with the read voltage in a comparison period; and
a second driving unit configured to drive the second node with a second voltage higher than a reference voltage in the non-comparison period, and drive the second node with the reference voltage in the comparison period,
wherein the first input terminal is electrically coupled with a first load including an RC delay, through the first current control unit, and the second input terminal is electrically coupled with a second load including an RC delay, through the second current control unit.

2. The current comparator according to claim 1, wherein an amount of current flowing through the first input terminal converges to a value based on a resistance value of the first load, and an amount of current flowing through the second input terminal converges to a value based on a resistance value of the second load.

3. The current comparator according to claim 1, wherein an amount of current flowing through the first input terminal decreases as a resistance value of the first load increases, and an amount of current flowing through the second input terminal decreases as a resistance value of the second load decreases.

4. The current comparator according to claim 1, wherein the first load is applied to a path including a variable resistance element, and the second load is applied to a path including a reference resistance element for discriminating a resistance value of the variable resistance element.

5. The current comparator according to claim 1,
wherein the current comparison block comprises:
a first sensing node corresponding to the first input terminal; and
a second sensing node corresponding to the second input terminal, and
wherein the current comparison block operates in the non-comparison period to precharge the first and second sensing nodes, and operates in the comparison period to discharge the first and second sensing nodes using current flowing through the first and second input terminals and compare voltages of the first sensing node and the second sensing node.

6. The current comparator according to claim 5, wherein the current comparison block comprises:
a coupling unit configured to electrically couple the first and second input terminals with the first and second sensing nodes, respectively, in the comparison period;
an amplification unit configured to amplify a voltage difference of the first and second sensing nodes and output the amplified voltage difference to first and second output nodes, in the comparison period; and
a precharge unit configured to precharge the first and second sensing nodes and the first and second output nodes.

7. The current comparator according to claim 1, wherein the first voltage and the second voltage have the voltage level of a power supply voltage.

8. A current comparator comprising:
a current comparison block configured to compare current flowing through first and second input terminals during a comparison period;
a first load corresponding to the first input terminal, and including a variable resistance element;
a second load corresponding to the second input terminal, and including a reference resistance element for discriminating a resistance value of the variable resistance element; and
a current driving block configured to provide a first current flowing through the first input terminal and the first load and a second current flowing through the second input terminal and the second load, such that the first and second currents exhibit peak values relatively shortly after entering the comparison period and starts to decrease,
wherein the first and second loads include capacitance components and the capacitance components of the first load and second load are respectively charged by the first current and the second current.

9. The current comparator according to claim 8, wherein the current driving block operates in the comparison period to decrease a driving force for driving the first current, from a first value to a read value smaller than the first value, and decrease a driving force for driving the second current, from a second value to a reference value smaller than the second value.

10. The current comparator according to claim 8, wherein the current driving block controls the driving force of the first current in response to a first control voltage and controls the driving force of the second current in response to a second control voltage, and lowers the first control voltage from a first level to a read level lower than the first level and lowers the second control voltage from a second level to a reference level lower than the second level.

11. The current comparator according to claim 8, wherein an amount of the first current converges to a value based on a resistance value of the first load, and an amount of the second current converges to a value based on a resistance value of the second load.

12. The current comparator according to claim 8, wherein an amount of the first current decreases as a resistance value of the first load increases, and an amount of the second current decreases as a resistance value of the second load increases.

13. An electronic device including a semiconductor memory unit, the semiconductor memory unit comprising:
a plurality of storage cells, each including a variable resistance element exhibiting different resistance states for storing data;
one or more reference cells corresponding to one or more storage cells of the plurality of storage cells, and including reference resistance elements for discriminating resistance values of variable resistance variable elements of the corresponding storage cells; and
a data read circuit configured to receive read current flowing through a storage cell selected among the plurality of storage cells through a first input terminal, receive reference current flowing through a reference cell corresponding to the selected storage cell through a second input terminal, and compare the read current and the reference current during a comparison period, and, wherein the data read circuit further operates in the comparison period to decrease a driving force for driving the read current, from a first value to a read value smaller than the first value, and decrease a driving force for driving the reference current, from a second value to a reference value smaller than the second value.

14. The electronic device according to claim 13, wherein the data read circuit controls the driving forces for driving the read current and the reference current in response to a first control voltage and a second control voltage, respectively, and lowers the first control voltage from a first level to a read level lower than the first level and lowers the second control voltage from a second level to a reference level lower than the second level.

15. The electronic device according to claim 13, wherein an amount of the read current converges to a value based on a resistance value of the resistance variable element of the selected storage cell, and an amount of reference current converges to a value based on a resistance value of the reference resistance element of the reference cell corresponding to the selected storage cell.

16. The electronic device according to claim 13,
wherein, if a resistance value of the resistance variable element of the selected storage cell is greater than a resistance value of the reference resistance element of the reference cell corresponding to the selected storage cell, an amount of the read current is smaller than an amount of the reference current, and
wherein, if a resistance value of the resistance variable element of the selected storage cell is smaller than a resistance value of the reference resistance element of the reference cell corresponding to the selected storage cell, an amount of the read current is greater than an amount of the reference current.

17. The electronic device according to claim 13, wherein the data read circuit comprises:

a current comparison block configured to compare the read current and the reference current;
a read current control unit configured to control the read current in response to a voltage of a first node;
a reference current control unit configured to control the reference current in response to a voltage of a second node;
a first driving unit operates in a non-comparison period to drive the first node with a first voltage higher than a read voltage, and, operates in the comparison period to drive the first node with the read voltage; and
a second driving unit operates in a non-comparison period to drive the second node with a second voltage higher than a reference voltage, and, operates in the comparison period to drive the second node with the reference voltage in the comparison period.

18. The electronic device according to claim 13, wherein the variable resistance elements comprise at least one of a metal oxide and a structure in which a tunnel barrier layer is interposed between two ferromagnetic layers.

19. The electronic device according to claim 13, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit that includes the variable resistance element is part of the cache memory unit in the processor.

* * * * *